US010177747B2

(12) United States Patent
Tessarolo et al.

(10) Patent No.: US 10,177,747 B2
(45) Date of Patent: Jan. 8, 2019

(54) HIGH RESOLUTION CAPTURE

(71) Applicant: Texas Instruments Incorporated, Dallas, TX (US)

(72) Inventors: Alexander Tessarolo, Lindfield (AU); Saya Goud Langadi, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 48 days.

(21) Appl. No.: 15/274,576

(22) Filed: Sep. 23, 2016

(65) Prior Publication Data
US 2017/0149418 A1    May 25, 2017

Related U.S. Application Data

(60) Provisional application No. 62/257,858, filed on Nov. 20, 2015.

(51) Int. Cl.
*G01R 23/02* (2006.01)
*H03K 3/03* (2006.01)
*H03K 5/159* (2006.01)
*H03K 19/20* (2006.01)

(52) U.S. Cl.
CPC ........... *H03K 3/0315* (2013.01); *G01R 23/02* (2013.01); *H03K 5/159* (2013.01); *H03K 19/20* (2013.01)

(58) Field of Classification Search
CPC ...... G01R 23/02; H03K 3/0315; H03K 5/159; H03K 19/20
See application file for complete search history.

(56) References Cited

U.S. PATENT DOCUMENTS

| 5,428,317 | A | * | 6/1995 | Sanchez | ............... H03K 3/0315 331/1 A |
| 7,642,866 | B1 | * | 1/2010 | Masleid | ............... H03K 3/0315 327/264 |
| 8,384,440 | B2 | | 2/2013 | Tessarolo et al. | |
| 2005/0047265 | A1 | * | 3/2005 | Yada | ........................ G06F 1/08 365/233.1 |

* cited by examiner

*Primary Examiner* — Levi Gannon
(74) *Attorney, Agent, or Firm* — Gregory J. Albin; Charles A. Brill; Frank D. Cimino (57) ABSTRACT

A high resolution capture circuit and integrated circuit chip are disclosed and include first and second capture delay lines and an oscillator delay line. The oscillator delay line includes N timing delay elements sequentially coupled in a ring to generate a first clock signal. The first and second capture delay lines each include M capture delay elements sequentially coupled to pass a received signal in a first direction along a first signal path and to pass a clock signal in a second direction opposite to the first direction along a second signal path. The first capture delay line uses the first clock signal and the second capture delay line uses an inverse of the first clock signal. Each capture delay element forms a flip-flop and provides a one-bit output. All delay elements have essentially identical timing and M is equal to either N or to N/2.

14 Claims, 8 Drawing Sheets

HIGH RESOLUTION CAPTURE

CLAIM OF PRIORITY AND RELATED PATENT APPLICATIONS

This nonprovisional application claims priority based upon the following prior U.S. provisional patent application(s): (i) "Enhanced High Resolution Capture," Application No.: 62/257,858, filed Nov. 20, 2015, in the name(s) of Alexander Tessarolo and Saya Goud Langadi; which is hereby incorporated by reference in its entirety.

FIELD OF THE DISCLOSURE

Disclosed embodiments relate generally to the field of capture circuits used to measure the time between edges of an input signal. More particularly, and not by way of any limitation, the present disclosure is directed to high resolution capture.

BACKGROUND

U.S. Pat. No. 8,384,440 B2, issued Feb. 26, 2013, provides a method of capturing time-stamping of input signals with very high resolution without requiring high frequency sampling. This patent, which shares inventorship with the present patent application and which is hereby incorporated by reference, uses a capture delay line to time stamp an input edge of signal as a fraction of the sampling frequency. The capture delay line receives the input signal at a first end and receives a version of the input signal that is synchronized to a clock signal at a second end that is opposite the first end. These two signals propagate toward one another through a sequence of capture delay elements. When the capture delay line is calibrated to the sampling frequency, the point at which the two signals cross each other within the sequence of capture elements indicates the time of signal transition at a resolution greater than possible via the sampling frequency clock alone. However, the use of this capture delay line is limited in the frequencies at which the circuit can be used. Additionally, calibration of the capture delay line requires both intensive calculations and that the delay line be offline for the duration of the calibration. Improvements to the existing circuit are desirable.

SUMMARY

Disclosed embodiments of a capture circuit utilize a ring oscillator formed of timing delay elements that have the same timing as the capture delay elements used in the capture delay line. The capture delay line is divided into two shorter capture delay lines, each of which can be either the same length as the oscillator delay line or alternatively, half the length of the oscillator delay line. The disclosed embodiments may offer one or more of the following improvement: a simplified calibration scheme, a fixed number of fractional bits that do not change across process, temperature and voltage (PTV) variations, and a reduced die-size.

In one aspect, an embodiment of a high resolution capture circuit is disclosed. The high resolution capture circuit includes an oscillator delay line comprising N timing delay elements sequentially coupled in a ring to generate a first clock signal; a first capture delay line comprising M capture delay elements sequentially coupled to pass a received signal in a first direction along a first signal pathway and to pass a first clock signal in a second direction opposite to said first direction along a second signal pathway; and a second capture delay line comprising M capture delay elements sequentially coupled to pass said received signal in said first direction along a third signal pathway and to pass a second clock signal that is an inverse of said first clock signal in said second direction along a fourth signal pathway, each capture delay element forming a flip-flop and providing a one-bit output; wherein M is selected from a group consisting of N and N/2 and further wherein said timing delay elements and said capture delay elements have essentially identical timing.

In one aspect, an embodiment of an integrated circuit (IC) chip is disclosed. The IC chip includes an oscillator delay line comprising N timing delay elements sequentially coupled in a ring to generate a first clock signal; a first capture delay line comprising M capture delay elements sequentially coupled to pass a received signal in a first direction along a first signal pathway and to pass a first clock signal in a second direction opposite to said first direction along a second signal pathway; and a second capture delay line comprising M capture delay elements sequentially coupled to pass said received signal in said first direction along a third signal pathway and to pass a second clock signal that is an inverse of said first clock signal in said second direction along a fourth signal pathway, each capture delay element forming a flip-flop and providing a one-bit output; wherein M is selected from a group consisting of N and N/2 and further wherein said timing delay elements and said capture delay elements have essentially identical timing; and a calibration circuit coupled to provide a ratio between a system clock and said high-resolution clock.

BRIEF DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. Further, in one or more example embodiments set forth herein, generally speaking, an element, component or module may be configured to perform a function if the element is capable of performing or otherwise structurally arranged to perform that function.

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 5A:
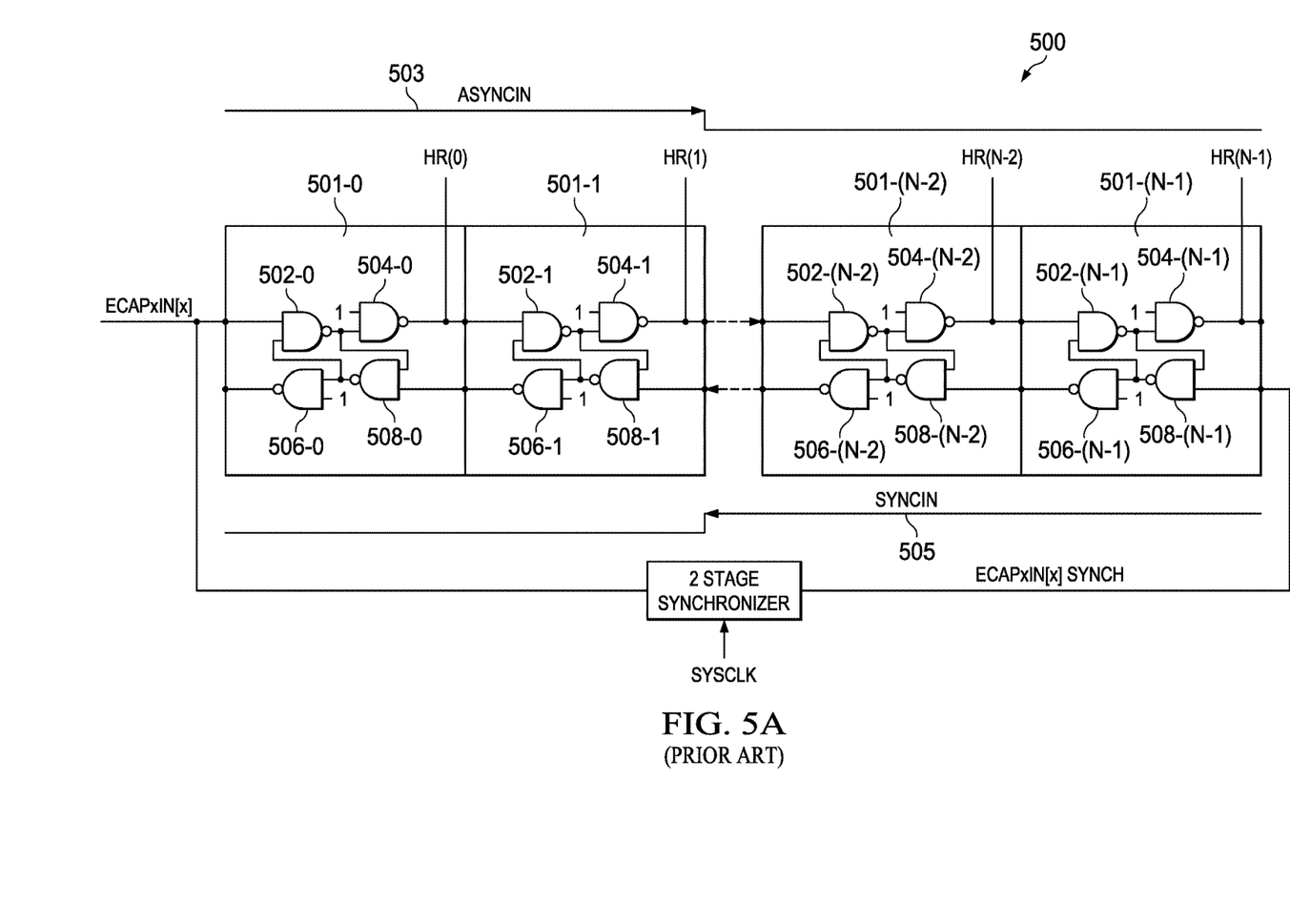
FIG. 5A depicts a simplified block diagram of a high resolution capture delay line according to the prior art.
Figure 5B:
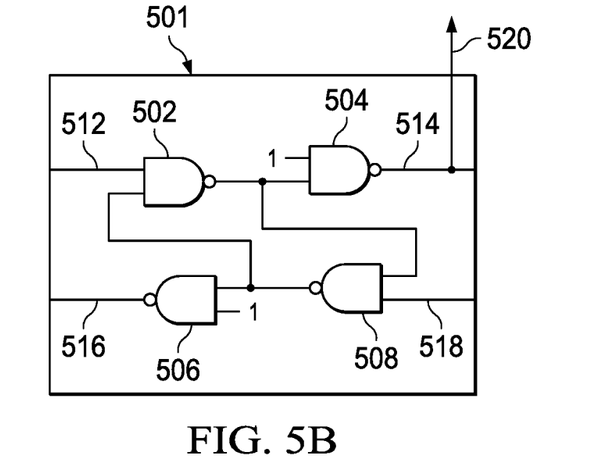
FIG. 5B depicts a block diagram of a delay line segment used to form the high resolution capture delay line of FIG. 5A.

FIG. 5A discloses a simplified block diagram of high resolution capture circuit 500 according to the prior art. By subdividing a single period of the system clock into smaller units, capture circuit 500 provides the ability to measure pulse width or to time stamp an edge of an input signal with an accuracy of about 200 picoseconds compared to 10 nanoseconds with a capture circuit clocked at 100 MHz. Capture delay line 500 consists of a series of capture delay elements 501, illustrated in FIG. 5B. Although capture delay element 501 is disclosed herein as a circuit using NAND gates, it will be understood that other logic circuits can be used to achieve the same results without deviating from the disclosed concept. Capture delay element 501 receives two input signals that are passed through the element in opposite directions and also provides a one-bit output on line 520. In capture delay element 501, NAND gate 502 receives an input on line 512. The output of NAND gate 502 is coupled to an input of NAND gate 504, which is configured as an inverter. The output of NAND gate 504 is provided on line 514. Similarly, NAND gate 508 receives an input on line 518. The output of NAND gate 508 is coupled to an input of NAND gate 506, which is also configured as an inverter. The output of NAND gate 506 is provided on line 516. The two signal lines are also cross-coupled, such that the output of NAND gate 502 is provided as a second input to NAND gate 508 and the output of NAND gate 508 is provided as a second input to NAND gate 502.

When N capture delay elements 501 are coupled sequentially together, they form a capture delay line as seen in FIG. 5A. A first signal, which in this embodiment is an input signal labeled ECAPxIN[x], is received on the upper signal path of capture delay element 501-0 as a first input to NAND gate 502-0. The output of the upper signal path of capture delay element 501-0 is provided to capture delay element 501-1 and is also provided as output HR(0). The input signal is passed along the upper signal path of capture delay line 500. A second signal, which in this embodiment is a synchronized version of the input signal, is received on the lower signal path of capture delay element 501-(N−1) as a first input to NAND gate 508-(N−1). The output of the lower signal path of capture delay element 501-(N−1) is provided to capture delay element 501-(N−2). This second signal will be passed along the lower signal path of capture delay line 500. Thus, it can be seen that input signal ECAPxIN[x], also referred to herein as ASYNCIN, is passed left to right through the upper signal path of capture delay line 500 and synchronized signal, ECAPxIN[x]SYNCH, also referred to a SYNCIN, is passed right to left through the lower signal path of capture delay line 500. SYNCIN is a version of the input signal that has been synchronized to the system clock.

A high ("1") input corresponding to a rising edge of input signal ASYNCIN causes NAND gate 502-0 to produce a low ("0") output; in the absence of any other input, inverter 504-0 produces a high ("1") output. This causes capture delay element 501-0 to take one of its two stable states and drives output HR(0) high ("1"). Inverter 504-0 propagates the high ("1") input from the rising edge of ASYNCIN to capture delay element 501-1. This causes a similar transition in capture delay element 501-1. Thus the rising edge of ASYNCIN propagates to the right in FIG. 5 as indicated by the arrow on the upper waveform 503.

Similarly, high ("1") input corresponding to a rising edge of synchronized signal SYNCIN causes NAND gate 508-(N−1) to produce a low ("0") output. In the absence of any other input, inverter 506-(N−1) produces a high ("1") output, which is propagated to capture delay element 501-(N−2). This causes a similar transition in capture delay element 501-(N−2). The rising edge of synchronized signal SYNCIN propagates to the left in FIG. 5 as indicated by the arrow on the lower waveform 505 and as the rising edge propagates, output 520 of each successive capture delay element is set to zero.

These two propagating signals will eventually meet. FIG. 5A illustrates an example where these signals meet between capture delay element 501-1 and capture delay element 501-2 (not specifically shown). When this happens, the "in the absence of any other input" is no longer true. The cross-coupled NAND gates 502, 508 of capture delay elements 501-1 and 501-2 will each have a "1" input. As a result, the status of the bit circuit will not change and neither SYNCIN nor ASYNCIN will propagate further. Thus, the status of each of capture delay elements 501 depends upon whether input signal ASYNCIN or synchronized signal SYNCIN reached that capture delay element first. The movement of these two signals thus results in a string of "1s" starting at capture delay element 501-0 going forward and a string of "0s" starting at capture delay element 501-(N−1) going backward and results in what is known as a thermometer code. This capture delay line outputs a unique value, referred as an HR value, which is proportional to a relative position of input signal ECAPxIN[x] with respect to the known reference edge. The HR value in conjunction with ECAP timestamp capabilities will result in high resolution on pulse width measurement. Decoding the values of the outputs provided at each of HR [N−1:0] value provides the relative position of ASYNCIN signal with respect to SYNCIN. For example, if the rising edge on ASYNCIN and SYNCIN occur at the same time, then capture delay line 500 will be frozen in the middle; the relative position of ASYNCIN is decoded by counting the number of '1's in HR output.

The length or delay of capture delay line 500 is defined by the maximum delay difference between ASYNCIN and SYNCIN. The HR output is always a series of '1's followed by '0's. The reference edge SINCIN always propagates through half of the delay line hence the rightmost outputs, e.g., HR [N/2:N], will always be 0 ×0. The number of '1's in the leftmost outputs, HR[N/2−1:0], will depending on the time difference between ASYNCIN 503 and SYNCIN 505. It will be understood that for a given length of delay line, the number of different steps possible are N/2 and the resolution offered by each step is equal to the time represented by the length of the capture delay line divided by (N/2).

If the synchronizer uncertainty is considered, the maximum time difference between input signal ASYNCIN and synchronized signal SYNCIN is 0 to 2*SYSCLK cycles. To be able to capture the relative position of the edge accurately, capture delay line 500 must span at least two SYSCLK periods. At the same time, a capture delay line having a given length can only support a fixed SYSCLK frequency, which means that the main clock of a system-on-chip (SOC) may or may not be usable for this circuit as the SOC may be operating at a different frequency. Greater flexibility can be achieved by providing a dedicated clock for the capture delay circuit that is independent of SOC clock; but such an added clock adds die-cost due to the requirements for a second phase locked look (PLL).

Figure 6:
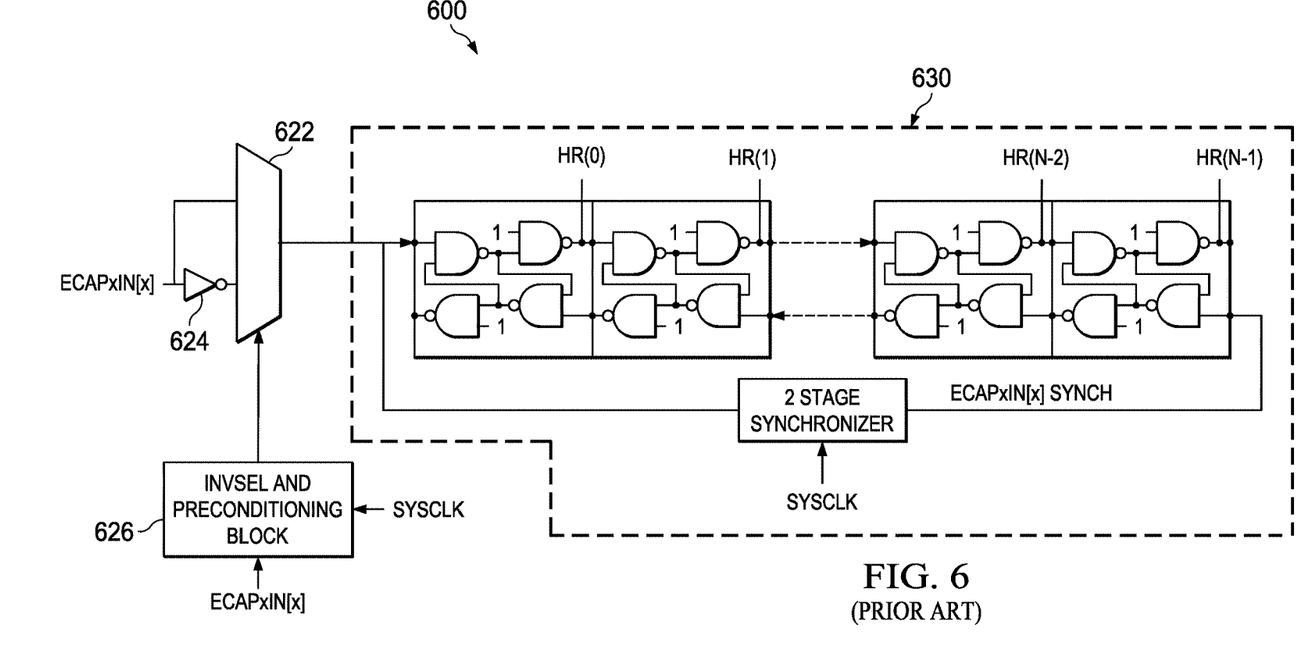
FIG. 6 depicts a modification to the high resolution capture delay line of FIG. 5A that allows capture of both a rising edge and a falling edge.

The capture delay line of FIG. 5A is only capable of providing the relative position when a rising edge occurs; however, this circuit can be modified, as shown in FIG. 6, to measure the relative position of both a rising edge and a falling edge. Circuit 600 includes circuit portion 630, which corresponds to circuit 500 shown in FIG. 5A, and also includes multiplexor 622, inverter 624 and INVSEL and preconditioning block 626. Inverter 624 inverts the input signal to create a rising edge from a falling edge of this signal. In this embodiment, once capture delay line 630 is frozen, no further captures are possible. To enable further captures, capture delay line 630 needs to be flushed out or taken to a reset state by forcing both inputs of capture delay line 630 to low. The following steps are repeated to achieve continuous captures:

Set INVSEL by sensing the INPUT;
Wait for capture event;
Toggle INVSEL; and
Precondition the delay line.

The total delay of the prior art capture delay lines described thus far are variable with regard to PTV but the frequency of the system clock is independent of these factors. For this prior art circuit to work reliably, capture delay line 500 or 630 needs to span two times the system clock cycle for best case process corners; at worst case process corners, the length of capture delay line 500 or 630 would become about three times the length of the system clock cycle. This means that not all values of HR[N−1:0] are valid due to the fact that delay line length is more than 2 cycles. The valid HR range is thus a variable and is a function of PTV, creating a need for calibration to identify a minimum valid value and a maximum valid value of the HR [N−1:0] values. The difference between the minimum and maximum valid values determines the number of steps possible, which also determines the resolution which can be achieved. These determinations require intensive calculation to identify the relative edge position. Additionally, the time necessary to precondition or reset the capture delay line after every capture event also increases, which limits the maximum frequency of the input signals of these circuits.

Applicants have identified a novel architecture for a capture delay line circuit, which in one embodiment has the following main components:

A delay line having N delay elements is configured as a ring oscillator to generate clock signal HRCLK; and
Two capture delay lines, each spanning half a cycle of HRCLK, each having N delay elements.

Figure 1:
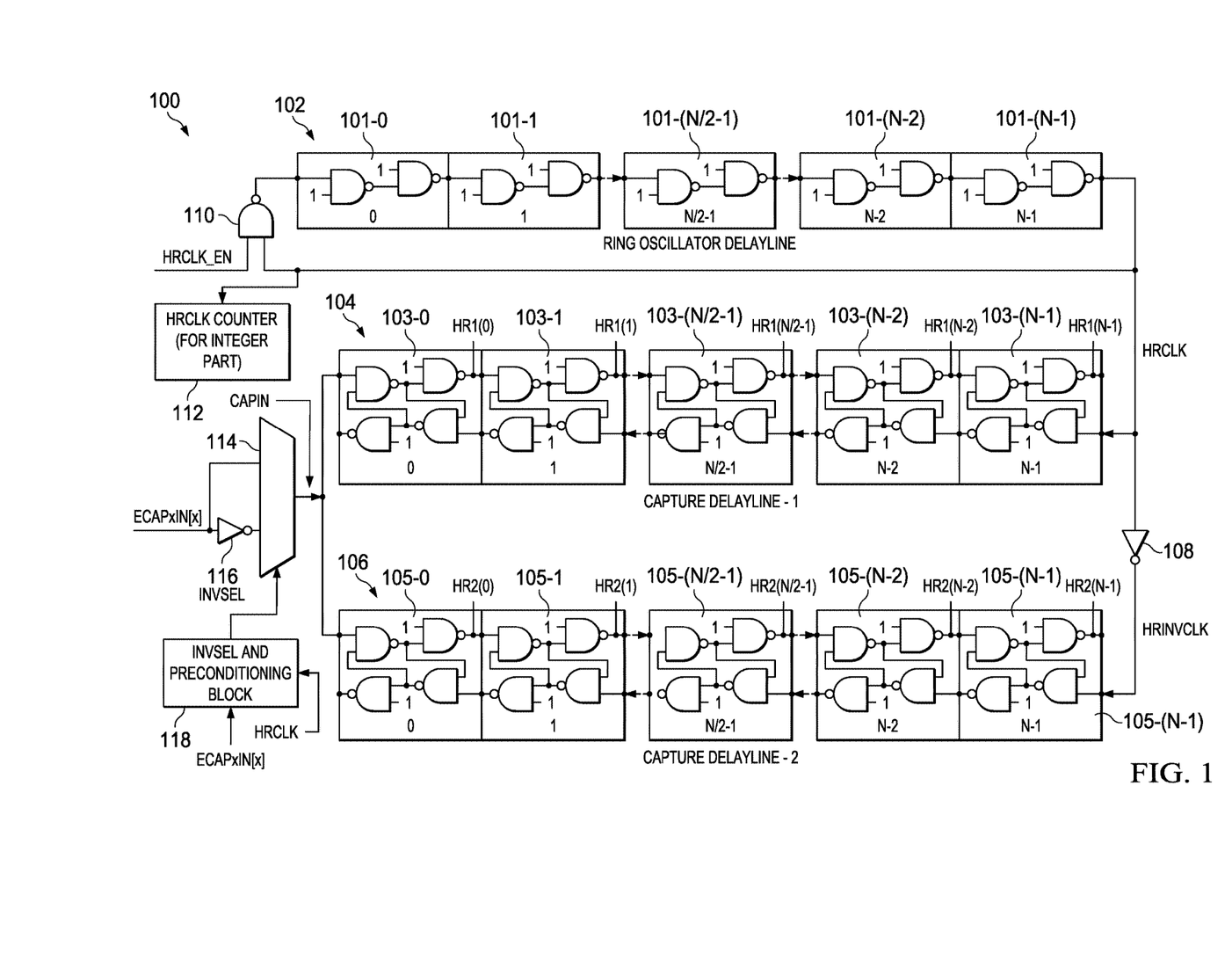
FIG. 1 depicts an example of a high resolution capture circuit according to an embodiment of the disclosure.

As seen in system 100, which is shown in FIG. 1, ring oscillator delay line 102, also referred to herein as simply oscillator delay line 102, is similar to capture delay lines 104, 106, but contains only a single signal path of the delay line. That is, each timing delay element 101-x that makes up oscillator delay line 102 is able to pass a single clock signal from one side of the timing delay element to the opposite side. Each oscillator delay element 101-x in oscillator delay line 102 has a similar delay to that of a capture delay element 103-x, 105-x in capture delay lines 104, 106. Since the delay of capture delay lines 104, 106 is the same as the delay of oscillator delay line 102 and each capture delay line always spans for one clock (i.e., one-half cycle) of HRCLK, the following limitations in the earlier patented method are removed:

A specific frequency clock is not needed, so an additional PLL is not needed and there is no dependency on the SOC clock
The capture delay line length does not need to span two clock cycles; and
The number of capture delay elements and thus the fractional bits determined are always the same.

Oscillator delay line 102 generates clock signal HRCLK, which is used as a reference edge on capture delay line 104, while inverter 108 creates an inverted version of HRCLK called HRINVCLK, which is used as a reference edge on capture delay line 106. At reset, oscillator delay line 102 is not enabled, but can be enabled at NAND gate 110 by setting HRCLK_EN high. It is worth noting at this point that HRCLK itself is used as a reference edge in the current circuit, unlike the edge of the synchronized signal used in the earlier version.

Figure 2A:
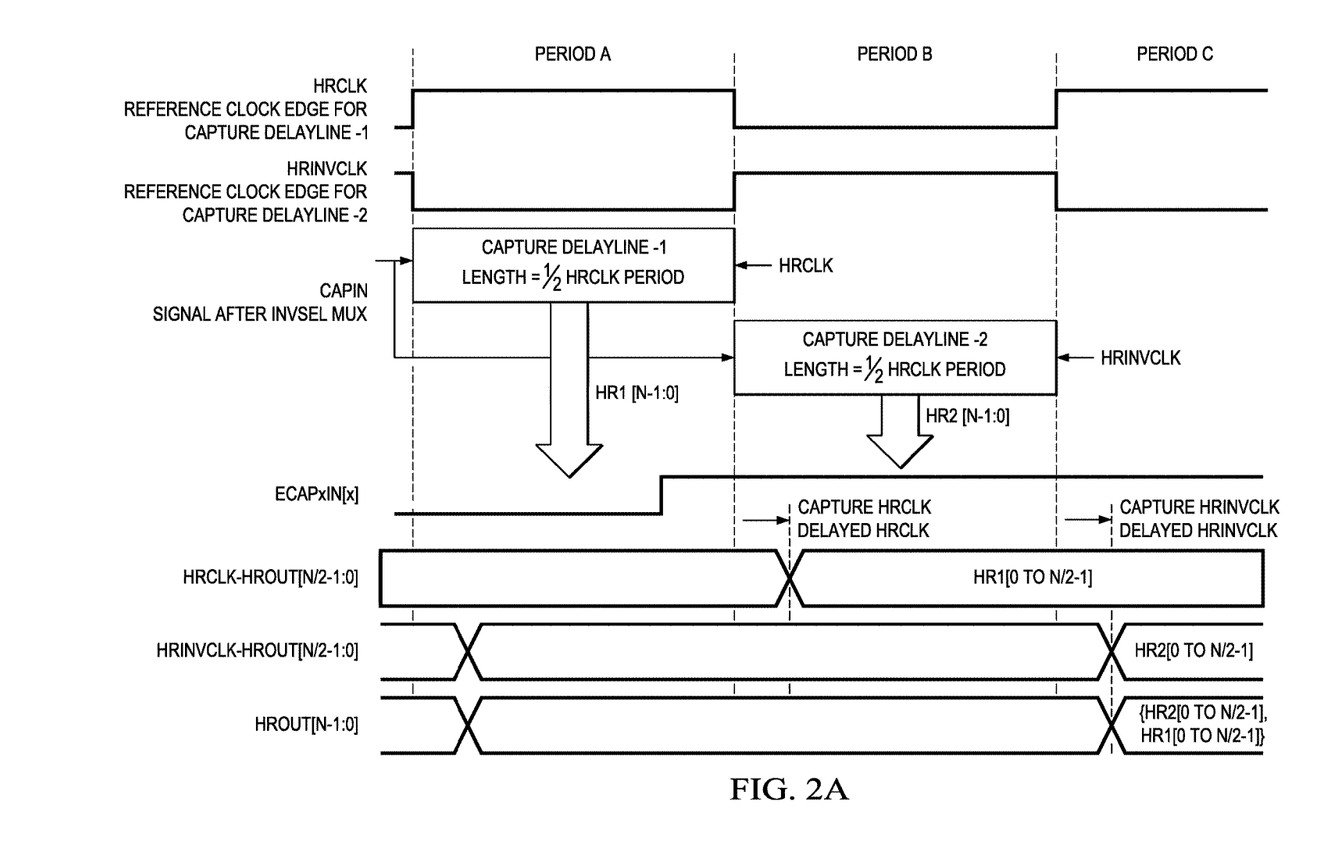
FIG. 2A depicts various signals and capture events for the capture circuit of FIG. 1 according to an embodiment of the disclosure.

The two capture delay lines 104, 106 together provide the relative position of a rising edge on signal ECAPxIN. Capture delay line 104 provides the position if the rising edge occurs when HRCLK clock is at logic level '1'; capture delay line 106 provides the position if the rising edge occurs when HRCLK clock is at logic level '0'. FIG. 2A illustrates the signals used in the disclosed circuit and will be explained with reference back to FIG. 1. Capture delay line 104 is fed with reference edge HRCLK. Thus, during period A shown in FIG. 2A, HRCLK is high and the rising edge of the clock will propagate right-to-left along the lower signal path in capture delay line 104. If ECAPxIN[x] goes high during this first half cycle of HRCLK, that value will propagate left-to-right along the upper signal path in capture delay line 104 and the output values of capture delay line 104 will have some ones. As seen in the example of FIG. 2A, ECAPxIN[x] goes high during the first half-cycle. The output of capture delay line 104 is latched into HRCLK-HROUT on the falling edge of HRCLK and is sent as signal HRCLK-HROUT[N/2−1:0] after a short delay.

During period B, capture delay line 106 receives the reference edge of HRINVCLK, which propagates right-to-left across the lower signal path of capture delay line 106. Since ECAPxIN[x] is high during the entire second half of HRCLK, the output values of capture delay line 106 will have ones through half the length of capture delay line 106. The output of capture delay line 106 is latched into HRINVCLK-HROUT on the falling edge of HRINVCLK and is sent as signal HRINVCLK-HROUT[N/2−1] after a short delay. Once both values are captured, the two values are concatenated and sent as HROUT[N−1:0]. Counting the number of ones in HROUT will give the relative edge position of ECAPxIN[x] with respect to the HRCLK rising edge transition.

The resolution of HRCAP is determined by the number of elements in capture delay lines 104, 106 and by the frequency of the ring oscillator clock 102. For a capture delay line with N elements, the only possible HR values are N/2 because fifty percent of the HR output from the capture delay elements is always captured as logic '0', since the delay line always freezes at or before the midpoint. Considering both capture delay lines, each having N elements, the total number of possible HR values are N. The resolution is then equal to the period of HRCLK divided by N.

Figure 2B:
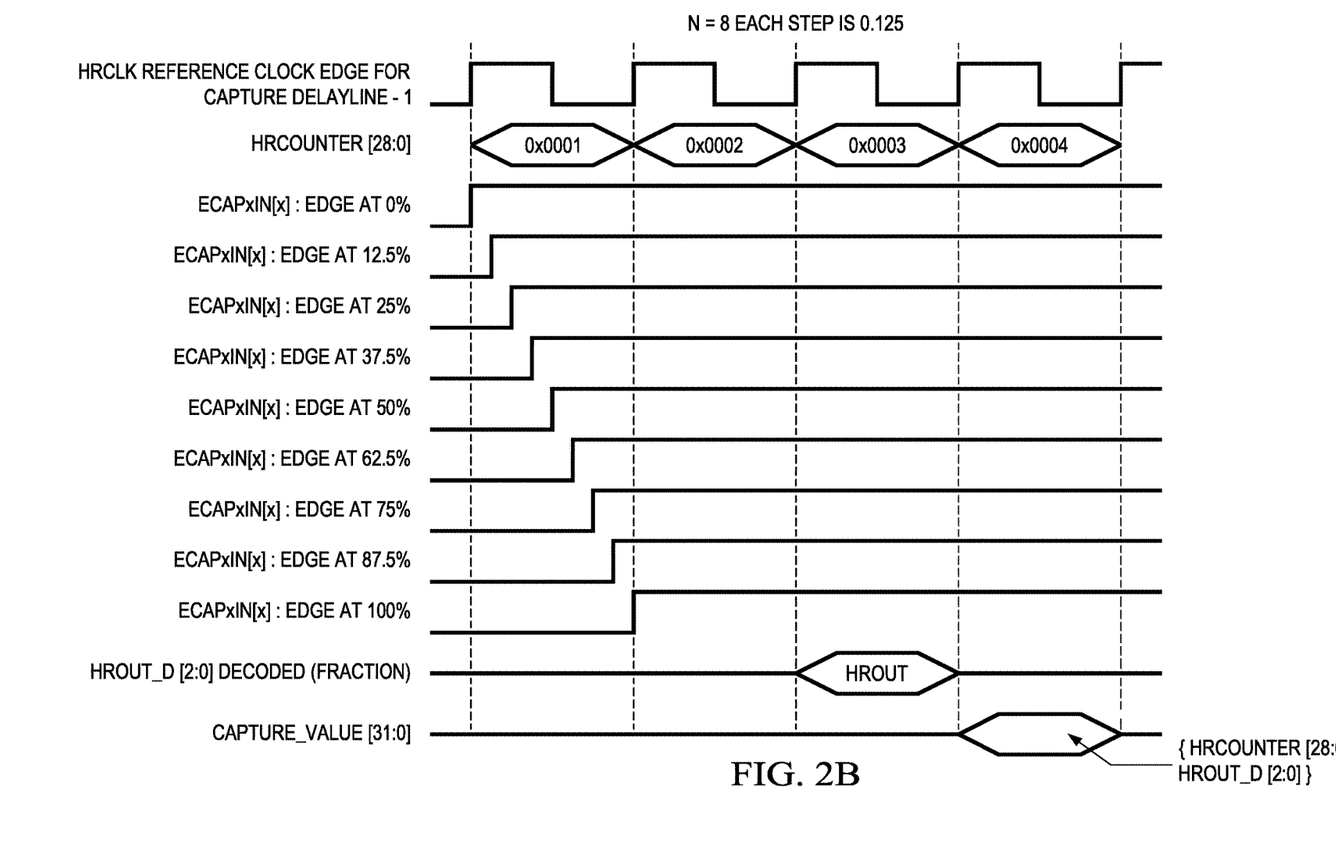
FIG. 2B depicts the output from the high resolution capture circuit for a transition occurring at various times during the HRCLK cycle according to an embodiment of the disclosure.

FIG. 2B illustrates the value of HRCAP when the value of the input signal goes high at various points during a clock cycle of HRCLK according to an example embodiment that has eight delay elements in each delay line. Since each of the delay lines has eight delay elements, each of capture delay lines 104, 106 contributes four bits to the value of HRCAP; i.e., it will be understood that since the rightmost bits in each of capture delay lines 104, 106 are always zero, these values do not need to be captured and transmitted. Table 1 illustrates the values of HROUT for each of the positions shown in FIG. 2B.

TABLE 1

| ECAPxIN[x] | HROUT | HR Value | Capture Value |
|---|---|---|---|
| 0% | 1111_1111 | 0.000 | 3.000 |
| 12.5% | 1111_1110 | 0.125 | 3.125 |
| 25% | 1111_1100 | 0.250 | 3.250 |
| 37.5% | 1111_1000 | 0.375 | 3.375 |
| 50% | 1111_0000 | 0.500 | 3.500 |
| 62.5% | 1110_0000 | 0.625 | 3.625 |
| 75% | 1100_0000 | 0.750 | 3.750 |
| 87.5% | 1000_0000 | 0.875 | 3.875 |
| 100% | 1111_1111 | 1.00 | 4.000 |

Assuming that HRCLK is 100 MHz, the resolution offered by the configuration of FIG. 2B is 1.25 ns. It will be further understood that by increasing the number of delay elements in the ring oscillator and each of the delay lines, this resolution can be increased.

Although the frequency of HRCLK is dependent on PTV, the number of steps (N) in the delay lines will remain the same. This fact eases the calculations when the frequency needs to be converted to absolute time, requiring only simple multiplication by the ratio of a reference clock to HRCLK. In the disclosed embodiments, HRCLK counter 112, which contributes to the integer part of the captured value, also runs off HRCLK. In one embodiment, for a capture event, both HROUT and time base counter HRCLK COUNTER are captured and represented as one 32-bit number. HROUT will be stored as a given number, F, of least significant bits (LSB) (F-1:0), HRCLK COUNTER is captured into bits (32:F). For example, if N=128 then HRCLK COUNTER is 25 bits and the fractional value (F) is represented using 7 LSB bits.

Applicant further notes that with inverter 116 and multiplexor 114, which is controlled by INVSEL and preconditioning block 118, the circuit can be utilized to detect both rising and falling edges on the incoming signal. When detection of both rising and falling edge is desired, the delay lines should be cleared between captures, in a manner similar to that discussed with regard to FIG. 6.

Figure 3:
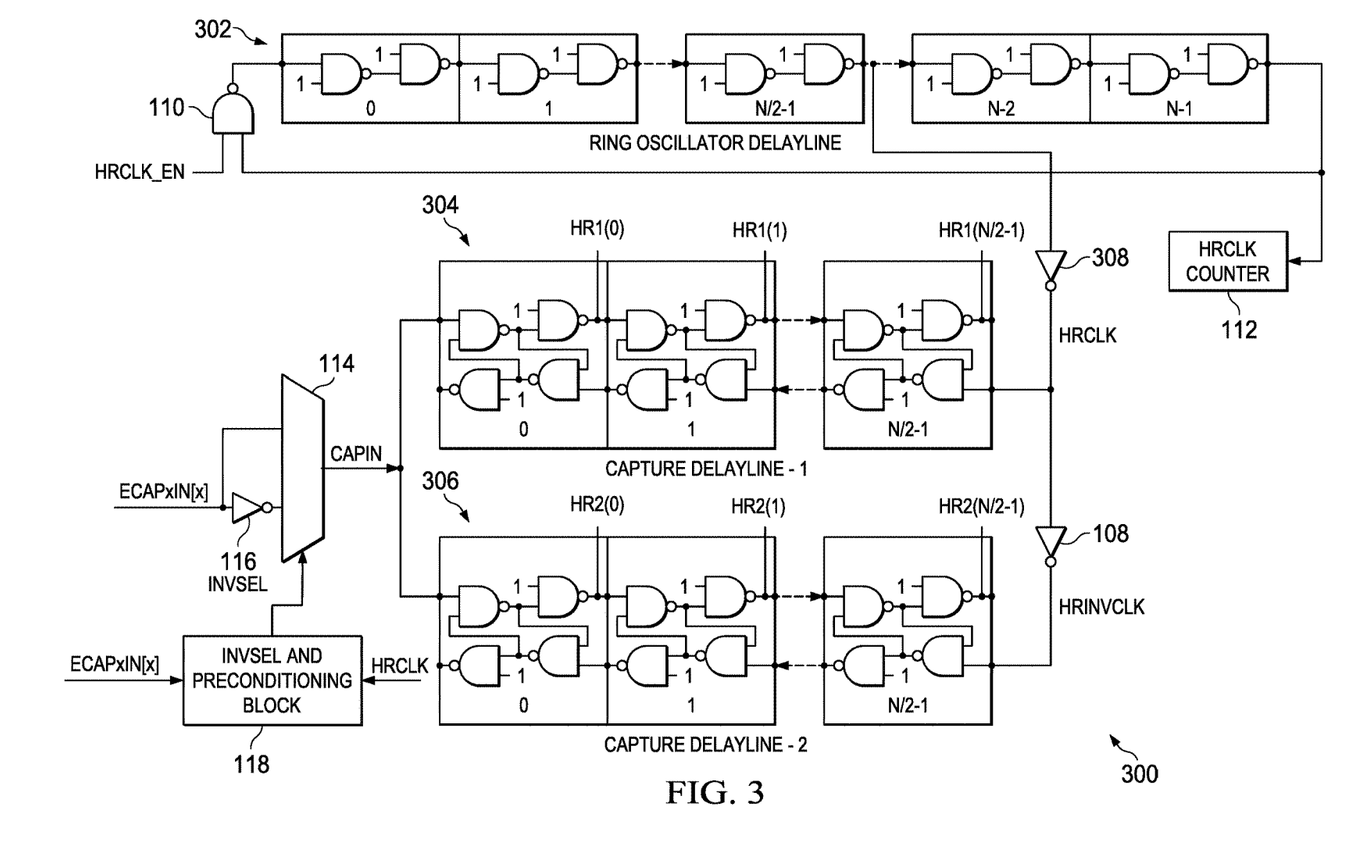
FIG. 3 depicts an example of a high resolution capture delay line according to an embodiment of the disclosure.

FIG. 3 discloses an alternate embodiment of the disclosed capture circuit that provides further optimization. In capture circuit 300, the length of each of capture delay lines 304, 306 is equal to M, which is N/2, making the capture delay lines 304, 306 half the length of oscillator delay line 302. Applicants have realized that since the rightmost bits of the delay line are always zero when a rising edge is captured, these rightmost bits can be eliminated by delaying the clock signal used to time capture delay lines 304, 306 by a quarter of a clock cycle. As seen in this figure, this is accomplished by taking the clock signal for the capture delay lines at a point half-way through oscillator delay line 302, i.e., between element N/2−1 and element N/2, and by adding inverter 308. Other elements of this embodiment remain the same as in FIG. 1.

Since the number of delay elements N in each delay line is always the same and since the capture delay lines span either one-half or else one cycle of HRCLK at any PTV, there is no need to find the range of acceptable frequencies that can be used at a given PTV as in earlier implementation. The previous method fed the PWM waveform and varied the duty cycle with a granularity of 150 ps to detect the allowable range. The disclosed method does not require these actions, hence the need for HRCAP to be unusable during calibration has been obviated. Calibration is now needed only if one is interested in getting the absolute pulse width or frequency of incoming signals. In such a case, the only data needed is a ratio between the known frequency of SYSCLK and HRCLK.

Figure 4A:
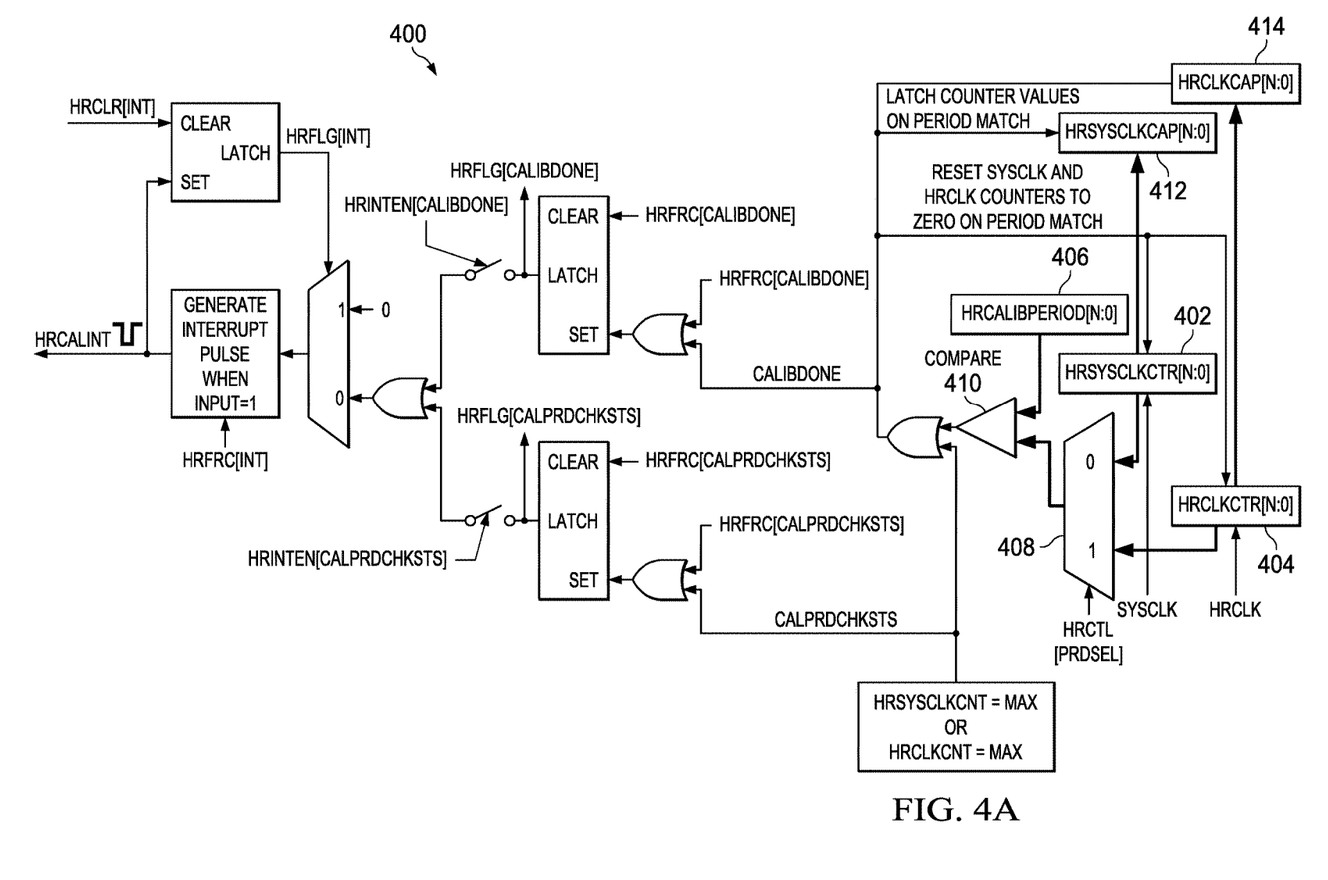
FIG. 4A depicts a calibration circuit for use with the disclosed high resolution capture circuit according to an embodiment of the disclosure.

FIG. 4A illustrates a calibration circuit 400 that can be used with the disclosed embodiment. HRSYSCLKCNT 402 is a 32 bit counter that counts SYSCLK; this counter will start counting when CALIBSTART is set to start the calibration. HRCLKCNT 404 is a second 32 bit counter that counts HRCLK and will also start counting when CALIBSTART is set. HRCALIBPERIOD 406 is a calibration period. The calibration is stopped when comparator 410 determines that one of these counter values matches the selected calibration period. Which clock is compared to the calibration period is programmable using the PRDSEL bit and multiplexor 408. On a calibration period match, the value of HRSYSCLKCNT 402 is captured into HRSYSCLKCAP 412 and the value of HRCLKCNT 404 is captured into HRCLKCAP 414. Capturing both counters completes the calibration cycle and an interrupt is generated to the CPU. The ratio of SYSCLK/HRCLK is then a simple calculation. Since there is no need to stop the operation of the capture delay line to perform the calibration, the calibration can run in the background at all times and be easily accessible.

Figure 4B:
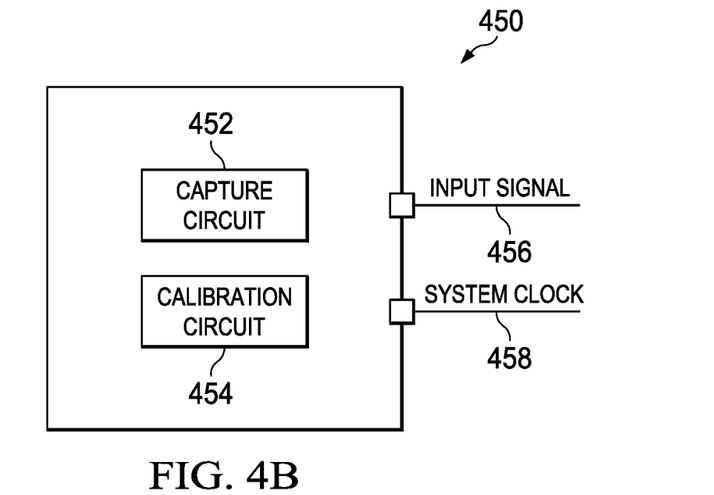
FIG. 4B depicts a block diagram of an integrated circuit chip including a high resolution capture circuit according to an embodiment of the disclosure.

FIG. 4B discloses an integrated circuit chip (IC) 450 that includes both capture circuit 452 and calibration circuit 454. In one embodiment, capture circuit 452 corresponds to capture circuit 100 shown in FIG. 1 and calibration circuit 454 corresponds to calibration circuit 400 of FIG. 4A. IC chip 450 receives an input signal whose rising and/or falling edges are to be tracked at pin 456 and also receives system clock (SYSCLK) signal on pin 458.

Applicants have disclosed a novel capture circuit that provides a higher resolution capture without increasing the sampling rate. Embodiments of the novel circuit can provide one or more of the a simplified calibration scheme, a fixed number of fractional bits that do not change across process, temperature and voltage variations, and a reduced die-size. Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A capture circuit comprising:
   an oscillator delay line comprising N timing delay elements and a logic gate sequentially coupled in a ring to generate a first clock signal;
   a first capture delay line comprising M capture delay elements sequentially coupled to pass a received signal in a first direction along a first signal pathway and to pass a second clock signal in a second direction opposite to said first direction along a second signal pathway; and
   a second capture delay line comprising M capture delay elements sequentially coupled to pass said received signal in said first direction along a third signal pathway and to pass a third clock signal that is an inverse of said second clock signal in said second direction along a fourth signal pathway, each capture delay element forming a flip-flop and providing a one-bit output;
   wherein M is selected from a group consisting of N and N/2.

2. The capture circuit as recited in claim 1 wherein M=N/2 and said second clock signal and said third clock signal are delayed by one quarter cycle from said first clock signal generated by said oscillator delay line.

3. The capture circuit as recited in claim 1 wherein M=N and said second clock signal and said third clock signal are synchronous with said first clock signal generated by said oscillator delay line.

4. The capture circuit as recited in claim 1 wherein said capture delay elements comprise:
   a first NAND gate having a first input, a second input and an output coupled to a first inverter, wherein an output of said first inverter is coupled to said first input of said first NAND gate of a next sequential capture circuit segment and a first capture circuit segment is coupled to receive said received signal; and
   a second NAND gate having a first input, a second input and an output coupled to a second inverter, wherein an output of said second inverter is coupled to said first input of said second NAND gate of a previous sequential capture circuit segment, an Nth capture circuit segment is coupled to receive one of said second and third clock signals, said output of said first NAND gate is coupled to said second input of said second NAND gate and said output of said second NAND gate is coupled to said second input of said first NAND gate.

5. The capture circuit as recited in claim 4 wherein said timing delay elements comprise a third NAND gate connected as an inverter and further coupled to provide an output to a third inverter, an output of said third inverter coupled to a first input of a next sequential timing delay element.

6. The capture circuit as recited in claim 5 wherein said first clock signal is further coupled to a counter.

7. The capture circuit as recited in claim 6 further comprising a multiplexer coupled to provide said received signal as one of an input signal and an inverse of an input signal.

8. An integrated circuit (IC) chip comprising:
   a capture circuit comprising
      an oscillator delay line comprising N timing delay elements and a logic gate sequentially coupled in a ring to generate a first clock signal;
      a first capture delay line comprising M capture delay elements sequentially coupled to pass a received signal in a first direction along a first signal pathway and to pass a second clock signal in a second direction opposite to said first direction along a second signal pathway; and
      a second capture delay line comprising M capture delay elements sequentially coupled to pass said received signal in said first direction along a third signal pathway and to pass a third clock signal that is an inverse of said second clock signal in said second direction along a fourth signal pathway, each capture delay element forming a flip-flop and providing a one-bit output;
      wherein M is selected from a group consisting of N and N/2; and
   a calibration circuit coupled to provide a ratio between a system clock and said high-resolution clock.

9. The IC chip as recited in claim 8 wherein M=N/2 and said second clock signal and said third clock signal are delayed by one quarter cycle from said first clock signal generated by said oscillator delay line.

10. The IC chip as recited in claim 8 wherein M=N and said second clock signal and said third clock signal are synchronous with said first clock signal generated by said oscillator delay line.

11. The integrated circuit (IC) chip as recited in claim 8 wherein said capture delay elements comprise:
    a first NAND gate having a first input, a second input and an output coupled to a first inverter, wherein said first inverter is coupled to said first input of a next sequential capture circuit segment and a first capture circuit segment is coupled to receive said received signal; and
    a second NAND gate having a first input, a second input and an output coupled to a second inverter, wherein said second inverter is coupled to said first input of a previous sequential capture circuit segment, an Nth capture circuit segment is coupled to receive one of said second and third clock signals, said output said output of said first NAND gate is coupled to said second input of said second NAND gate and said output of said second NAND gate is coupled to said second input of said first NAND gate.

12. The IC chip as recited in claim 11 wherein said timing delay elements comprise a third NAND gate connected as an inverter and further coupled to provide an output to a third inverter, an output of said third inverter being coupled to a first input of a next sequential timing delay element.

13. The IC chip as recited in claim 11 wherein said first clock signal is further coupled to a counter.

14. The IC chip as recited in claim 8 further comprising a multiplexer coupled to provide said received signal as one of an input signal and an inverse of an input signal.

* * * * *